US006570295B2

(12) United States Patent
Herrmann et al.

(10) Patent No.: US 6,570,295 B2
(45) Date of Patent: May 27, 2003

(54) ULTRASOUND CONVERTER

(75) Inventors: Volker Herrmann, Klipphausen (DE); Günther Pfeifer, Dresden (DE); Michael Kochan, Medingen (DE)

(73) Assignee: Sick AG, Waldkirch (DE)

( * ) Notice: Subject to any disclaimer, the term of this patent is extended or adjusted under 35 U.S.C. 154(b) by 0 days.

(21) Appl. No.: 09/944,046

(22) Filed: Aug. 30, 2001

(65) Prior Publication Data

US 2002/0041130 A1 Apr. 11, 2002

(51) Int. Cl.[7] .......... H01L 41/08
(52) U.S. Cl. .......... 310/323.01; 310/311; 310/312
(58) Field of Search .......... 310/311, 312, 310/323.01, 323.12, 323.13, 323.19

(56) References Cited

U.S. PATENT DOCUMENTS 2,352,311 A * 6/1944 Di Toro .......... 310/312
3,845,332 A 10/1974 Last .......... 310/323.01
4,193,009 A * 3/1980 Durley, III .......... 310/317
4,757,227 A 7/1988 Danley et al. .......... 310/323.01
5,319,278 A * 6/1994 Myohga et al. .......... 310/323.12
5,486,733 A * 1/1996 Yamazaki et al. .......... 228/1.1

FOREIGN PATENT DOCUMENTS

GB 1430227 3/1976 .......... H04R/17/10
JP 2-228270 * 9/1990 .......... 310/311
SE 9301003 A * 9/1994 .......... G10D/13/02

* cited by examiner

*Primary Examiner*—Thomas M. Dougherty
(74) *Attorney, Agent, or Firm*—Townsend and Townsend and Crew LLP

(57) ABSTRACT

An ultrasound converter, especially of the axial oscillating type, with at least one piezoelectric element disposed between two tensioning segments and at least one tensioning member which prestresses the piezoelectric element via the tensioning segments. The tensioning element is a ring-shaped tensioning spring the walls of which have at least one peripheral recess.

15 Claims, 1 Drawing Sheet

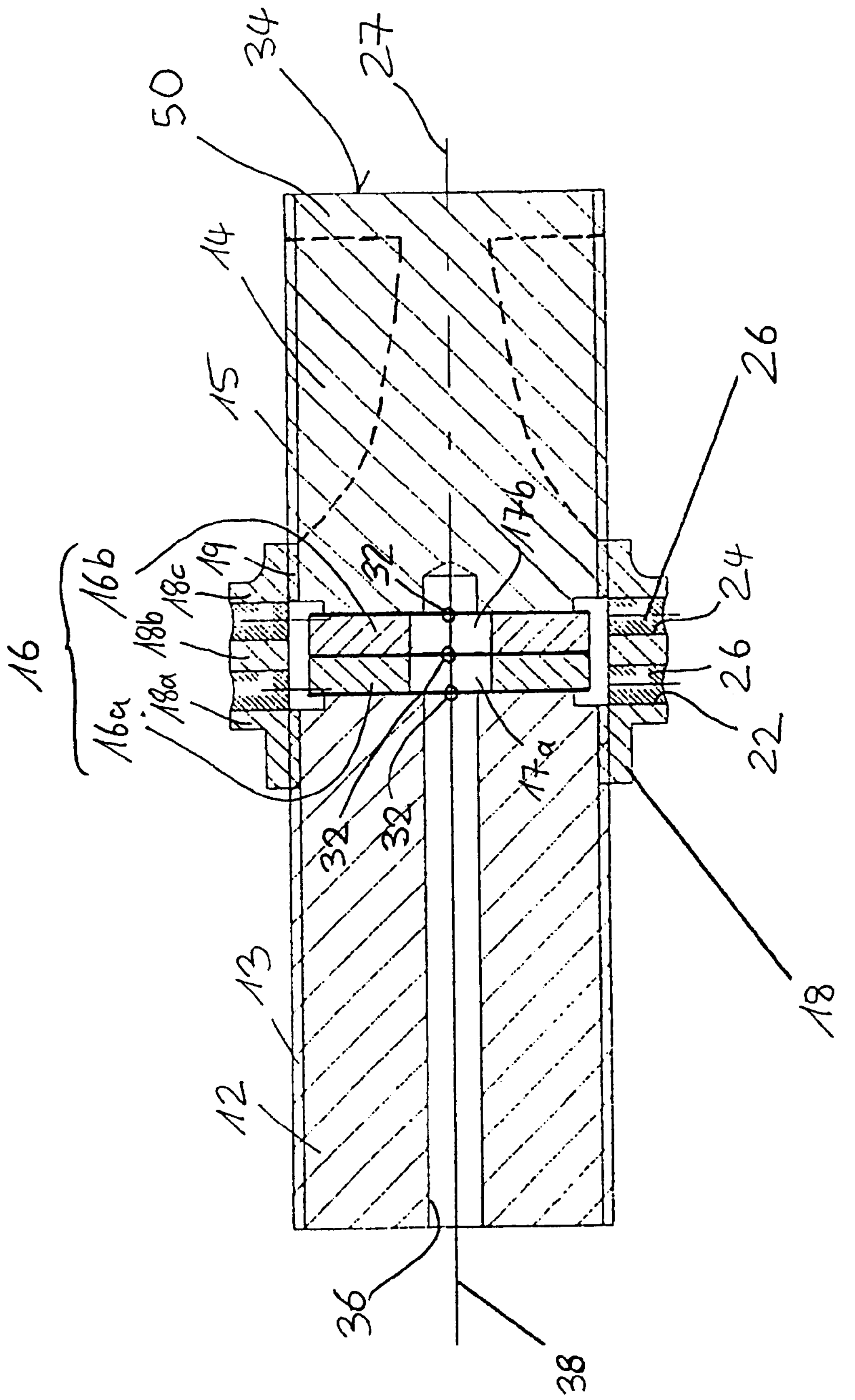
50
34
27
14
15
26
16
16a
16b
18a
18b
18c
19
32
32
32
17a
17b
24
26
22
18
13
12
36
38

ULTRASOUND CONVERTER

BACKGROUND OF THE INVENTION

1. Field of the Invention

The present invention concerns an ultrasound converter, and in particular a so-called axial oscillator, which has a piezoelectric element that is arranged between at least two tensioning segments and at least one tensioning member for pretensioning the piezoelectric element with the tensioning segments.

2. Description of the Prior Art

Ultrasound converters are also referred to as axial oscillators or λ/2 oscillators. The piezoelectric element has electrode surfaces which are polarized and electrically connected so that the entire structure resonates in an axial direction when an alternating current of suitable frequency is applied. The piezo element arranged between the tensioning segments is in a state of maximum mechanical tension and minimal mechanical oscillating speed. Ultrasound is emitted from the free face of one of the tensioning segments that functions as a wave guide or transmitter. To attain the highest possible wave emission with an adequate stability of the apparatus, the piezoelectric element is pretensioned with the tensioning member that acts via the tensioning segments.

SUMMARY OF THE INVENTION

It is an object of the present invention to provide an ultrasound converter as previously described which is as small as possible and which achieves the highest possible pretensioning of the piezoelectric element without adversely affecting the oscillating characteristics of the ultrasound converter.

The object is achieved with various features. A ring-shaped tension spring is used as the tensioning member which has at least one peripheral recess in its wall.

The peripheral recess in the ring-shaped tensioning member achieves a maximum spring travel while minimizing its axial length. The spring travel is large relative to the length of the device, which permits high prestressing of the piezoelectric element without exceeding the permissible load on the tension spring.

The tension spring can therefore oscillate even when highly pretensioned without adversely affecting the operation of the ultrasound converter.

Because of the small axial length of the tension spring of the invention, the spring cooperates only with those portions of the tensioning segments in the immediate vicinity of the piezoelectric element. In these areas, the oscillation amplitudes and oscillation speeds are small.

The tension spring of the present invention and the two tensioning segments are preferably threadably connected. The piezoelectric element is placed between the tensioning members and is threaded into the ring-shaped tensioning spring. The minimal axial length of the converter of the present invention prevents that the tensioning spring and the tensioning segments cooperate at portions of the threads which are axially far from the piezoelectric element where strong oscillations activities are encountered. An undesirable dampening in the areas of the threads is thereby avoided.

A further advantage of the present invention is that the dimensions of the peripheral recess of the tensioning spring can be adapted to the particular requirements of any given ultrasound converter. The peripheral recess is preferably dimensioned so that, for any given desired pretensioning of the piezoelectric element, the spring travel is sufficiently large without exceeding the maximum permitted tension in or loading of the tension spring material.

It is further possible to dimension the peripheral recess, including especially also as a function of the dimensions of the tension spring itself, so the operation of converters as broad band axial oscillators is not adversely affected by natural oscillation frequency modes of the tension spring at the operating frequency range or the principal transmission frequency range. It is further possible to configure the peripheral recess of the tension spring so that natural oscillation frequency modes are avoided which may be outside the operating frequency of the converter but which nevertheless can lead to undesirable interference in the operation of the converter. In this manner, the present invention makes it possible to optimize the natural oscillation frequency spectrum of the tension spring in dependence on the design and operating characteristics of the ultrasound converter.

The large spring travel that is attainable with the present invention has the further advantage that the influence of environmental parameters, such as temperature, on the operation of the ultrasound converter is minimal, and aging of the spring material can be compensated for. Accordingly, with the present invention, adjustments can be made to account for variations in the operations and/or environmental conditions and aging.

The peripheral recess is preferably shaped as a slit or gap. The circumferential recess further preferably extends in a radial direction through the entire wall of the ring spring; that is, the wall of the ring spring is preferably interrupted in an axial direction over the angle over which the peripheral recess extends.

In a particularly preferred embodiment of the present invention, an oscillation dampening material at least partially fills the peripheral recess. Interfering start and ending oscillations can in this manner be dampened and rendered harmless.

The use of a material that can be cast into the peripheral recesses is preferred.

The use of a dampening mass which at least partially fills the peripheral recess is particularly advantageous for converters which generate or receive short ultrasound impulses because for such converters the beginning and ending oscillations have a relatively large impact on measurements.

According to another preferred embodiment, a good way to adapt the tensioning spring to any given application is to provide two axially spaced peripheral recesses in the tensioning spring.

Such a two-stage construction combines high tensioning with large spring travel without appreciably increasing the axial length of the device and without significantly making the elimination of interfering natural oscillation frequency modes more difficult.

The object of the present invention can also be satisfactorily attained by providing three or more peripheral recesses. Eliminating or reducing interfering natural oscillation frequency modes in this manner however is more costly. In such instances, it is possible, and the present invention permits, to configure the components of the ultrasound converter to match the optimal characteristics of the tensioning spring instead of designing the tensioning spring to fit the ultrasound converter.

BRIEF DESCRIPTION OF THE DRAWING

The FIGURE shows the embodiment of the invention.

DETAILED DESCRIPTION OF SPECIFIC EXEMPLARY EMBODIMENTS

An ultrasound converter in accordance with the present invention has two cylindrical tensioning segments 12, 14. Segment 12 is made of a heavy metal, for example steel, and the other segment 14 is made of a light metal, preferably titanium, aluminum or magnesium. However, other materials can also be used.

The two tensioning segments 12, 14 have exterior threads 13, 15 which engage an interior thread 19 of a ring-shaped tension spring 18. The tensioning spring 18 functions as a tensioning member. A piezoelectric element 16 is arranged between opposing face ends of tensioning segments 12, 14 and is compressed by tensioning spring 18. By varying the extent to which the tensioning segments 12, 14 are threaded into the tensioning spring, the degree to which the piezoelectric element 16 is pretensioned can be adjusted.

The piezoelectric element is preferably made of a piezo ceramic. As shown in FIG. 1, the piezoelectric element can be made up of a plurality of disks 16*a*, 16*b*.

Piezo disks 16*a*, 16*b* have flat electrodes 28. An AC voltage of predetermined frequency can be applied to connection points 32 of the electrodes so that the axial length of the piezoelectric element 16, that is, the thicknesses of the disks, varies correspondingly over time. Piezo element 16 therefore forms a source of an axial force which subjects the entire arrangement to axial or longitudinal oscillations. The use of an appropriate AC voltage frequency causes the entire arrangement to longitudinally resonate.

The free end face of tensioning segment 14 (shown on the right in FIG. 1) made of a light material serves as the emitting and/or receiving surface 34 from which ultrasound signals are sent or which receives ultrasound signals.

The piezoelectric element 16 is in the vicinity of maximal mechanical tension and minimal oscillating speed of the entire arrangement. The oscillating speed of the plane of the emitting and/or receiving surface 34, however, is at a maximum. This effect is enhanced by forming the tensioning segment 14 made of a light material so that its cross-section decreases in the direction of the emitting and/or receiving surface 34. The diameter of the free end of tensioning segment 14, however, increases again so that the emitting and/or receiving surface forms a plate-shaped end portion 50. This minimizes the weight without reducing the size of the emitting and/or receiving surface 34 because of the enlarged surface of plate 50. In FIG. 1, such a shape of tensioning segment 14 is schematically shown in dotted lines.

Such a structure, in which a one- or multi-piece piezoelectric element 16 is clamped between two tensioning segments 12, 13, is commonly referred to as an axial oscillator or a $\lambda/2$ oscillator.

Such an ultrasound converter is for example used by industry for measuring distances and for measuring flows by sending and receiving short ultrasound impulses.

Tensioning segment 12, shown in the left portion of FIG. 1, has a central channel 36 the center of which coincides with a longitudinal axis 27 of the entire arrangement. Channel 36 and central openings 17*a*, 17*b* in piezo disks 16*a*, 16*b* receive leads 38 for electrodes 28 via connections 32, all of which is only schematically shown in FIG. 1.

Tensioning spring 18 for pretensioning piezo element 16 has a short axial length. At about the middle of tensioning spring 18, in the area of piezo element 16, where the spring and the tensioning segments 12, 18 are threaded together, the spring extends radially outwardly.

In this middle part of tensioning spring 18, its wall has two peripheral recesses 22, 24 of identical, rectangular cross-sections. At the peripheral recesses 22, 24, the wall of tensioning spring 18 is completely cut through; that is, over the full circumferential extent of recesses 22, 24, the wall of tensioning spring 18 is interrupted in the axial direction.

The peripheral recesses 22, 24 can extend over a relatively larger or smaller angle, that is, over a relatively larger or smaller portion of the circumference of tensioning spring 18, as may be required by any given application. It is preferred that the remaining circumferential sectors of the spring, which each connect two of the recesses 22, 24 that are separated in the axial direction by portions 18*a*, 18*b*, 18*c* of tensioning spring 18, are circumferentially offset with respect to each other. It is for example possible to form the two recesses 22, 24 so that they are interrupted in a circumferential direction by only relatively short webs, which are circumferentially offset by 180° with respect to each other.

The recesses, slits or gaps 22, 24 generate zones of bending stresses in the wall of tensioning spring 18, causing it to act as a spring element. This increases the entire available axial spring travel of tensioning spring 18 without increasing the axial length of the device.

The peripheral recesses 22, 24 are dimensioned and arranged as a function of the dimensioning and especially the axial length of tensioning spring 18 so as to avoid its natural oscillation frequencies at the working frequency range or the main transmission frequency range of the ultrasound converter. By appropriately configuring the peripheral recesses 22, 24, the tensioning spring 18 is readily adapted to the ultrasound converter and/or its operating parameters.

A dampening mass 26 is further cast into the peripheral recesses 22, 24 to dampen undesirable startup and ending oscillations. Such startup and ending oscillations can occur outside the operating frequency of the ultrasound converter by the natural oscillation frequencies of the tensioning spring 18. A satisfactory operation of the ultrasound converter of the invention is principally also possible without casting a dampening material into recesses 22, 24. However, without an oscillation dampening material in peripheral recesses 22, 24, operation of the ultrasound converter can be adversely affected by the natural oscillation frequencies of ring spring 18 under certain operating conditions. The material in recesses 22, 24 prevents this.

By selecting an appropriate dampening material 26, for example an elastic casting material, the tensioning spring 18 can be adapted to prevailing conditions and requirements.

Contrary to the above-described embodiments of the invention employing two-step recesses, slits or gaps, tensioning spring 18 can also be provided with only a single peripheral recess or, alternatively, with three or more circumferential recesses.

What is claimed is:

1. An ultrasound converter comprising at least one piezoelectric element between two tensioning segments and at least one tensioning member, wherein the piezoelectric element is pretensioned by the tensioning segments and wherein the tensioning organ comprises a ring-shaped tensioning spring which has a wall in which at least one peripheral recess is formed.

2. An ultrasound converter according to claim 1, wherein two axially spaced-apart peripheral recesses are provided.

3. An ultrasound converter according to claim 1, wherein the natural oscillation frequency spectrum of the tensioning spring is optimized as a function of the ultrasound converter.

4. An ultrasound converter according to claim 1, wherein the tensioning spring is formed so that natural oscillation frequencies of the tensioning spring in the operating frequency range of the ultrasound converter are prevented.

5. An ultrasound converter according to claim 1, wherein the tensioning spring is formed so that at least one of startup and ending oscillations resulting from natural oscillation frequencies of the tensioning spring outside an operating frequency range of the ultrasound converter are reduced.

6. An ultrasound converter according to claim 1, wherein the peripheral recesses are at least partially filled with an oscillation dampening material.

7. An ultrasound converter according to claim 1, wherein the peripheral recesses comprise slits or gaps.

8. An ultrasound converter according to claim 1, wherein the peripheral recesses have a rectangular cross-section.

9. An ultrasound converter according to claim 1, wherein axial end surfaces of the peripheral recesses are vertical to a longitudinal axis of the tensioning spring.

10. An ultrasound converter according to claim 1, wherein the wall of the tensioning spring at the peripheral recess is interrupted.

11. An ultrasound converter according to claim 1, wherein the tensioning spring extends radially outward in the area of the peripheral recess.

12. A tensioning member for an ultrasound converter comprising a ring-shaped tensioning spring having a wall which forms at least one peripheral recess.

13. An ultrasound converter in accordance with claim 6 wherein the peripheral recesses are at least partially filled with a casting mass.

14. An ultrasound converter according to claim 1 wherein the ultrasound converter is an axially oscillating ultrasound converter.

15. An ultrasound converter in accordance with claim 3 wherein the operating frequency range of the tensioning spring is optimized as a function of the ultrasound converter.

* * * * *